United States Patent
Friebe et al.

(10) Patent No.: US 8,240,546 B2
(45) Date of Patent: Aug. 14, 2012

(54) FILM PACKAGING HAVING TAMPER-EVIDENT MEANS

(75) Inventors: Joachim Friebe, Heimertingen (DE); Matthias Schraegle, Altusried (DE)

(73) Assignee: Huhtamaki Ronsberg, Zweigniederlassung der Huhtamaki Deutschland GmbH & Co. KG, Ronsberg/Allgaeu (DE)

( * ) Notice: Subject to any disclaimer, the term of this patent is extended or adjusted under 35 U.S.C. 154(b) by 1077 days.

(21) Appl. No.: 11/911,812

(22) PCT Filed: Apr. 18, 2005

(86) PCT No.: PCT/EP2005/004118
§ 371 (c)(1),
(2), (4) Date: Mar. 11, 2008

(87) PCT Pub. No.: WO2006/111177
PCT Pub. Date: Oct. 26, 2006

(65) Prior Publication Data
US 2008/0203141 A1 Aug. 28, 2008

(51) Int. Cl.
*B65D 65/00* (2006.01)
*B65D 65/26* (2006.01)
*B65D 33/14* (2006.01)
*B65D 33/00* (2006.01)
*B65D 33/16* (2006.01)

(52) U.S. Cl. ...... 229/87.01; 229/87.05; 383/5; 383/203; 383/211; 383/61.1

(58) Field of Classification Search ............. 383/5, 210, 383/211, 61.1; 229/87.01, 87.05, 87.08, 229/87.11
See application file for complete search history.

(56) References Cited

U.S. PATENT DOCUMENTS

| 2,370,226 A | 2/1945 | Brede |
| 2,626,647 A | 1/1953 | Barton |
| 2,847,151 A | 8/1958 | Meyer-Jagenberh |
| 3,128,913 A | 4/1964 | Specketer |
| 3,217,951 A | 11/1965 | Paal |
| 3,291,377 A | 12/1966 | Eggen |
| 3,313,333 A | 4/1967 | Lordi |
| 3,317,110 A | 5/1967 | Palmer |
| 3,396,899 A | 8/1968 | Strouse et al. |

(Continued)

FOREIGN PATENT DOCUMENTS

AT 293944 10/1971

(Continued)

OTHER PUBLICATIONS

Allcock, Harry R., "Contemporary Polymer Chemistry"—1990, Prentice Hall, second edition, p. 34, 1990.

(Continued)

*Primary Examiner* — Jes F Pascua
(74) *Attorney, Agent, or Firm* — Knobbe Martens Olson & Bear LLP

(57) ABSTRACT

Flow-wrap packaging having a longitudinal sealed seam and two transverse sealed seams, at least the longitudinal sealed seam being spaced apart from the associated longitudinal edge of the packaging, wherein a device for indicating whether the packaging has already been opened (seal guarantee) is arranged at at least one point between the longitudinal sealed seam and the longitudinal edge ,that is to say at at least one point on the longitudinal edge strips of the packaging defined by the longitudinal sealed seam and the longitudinal edge.

8 Claims, 3 Drawing Sheets

U.S. PATENT DOCUMENTS

| | | | |
|---|---|---|---|
| D214,023 S | 5/1969 | Beaumont | |
| 3,519,158 A | 7/1970 | Anderson | |
| 3,548,564 A | 12/1970 | Bruce et al. | |
| 3,604,491 A | 9/1971 | Spiess | |
| 3,608,709 A | 9/1971 | Pike et al. | |
| 3,616,898 A * | 11/1971 | Massie | 206/216 |
| 3,690,524 A | 9/1972 | Haberhauer | |
| 3,832,964 A | 9/1974 | Rockefeller | |
| 3,935,993 A | 2/1976 | Doyen et al. | |
| 3,937,396 A | 2/1976 | Schieder | |
| 3,997,677 A | 12/1976 | Hirsch et al. | |
| 4,091,929 A | 5/1978 | Krane et al. | |
| 4,116,359 A | 9/1978 | Josephy | |
| 4,132,331 A | 1/1979 | Magerle | |
| 4,210,674 A | 7/1980 | Mitchell | |
| 4,216,268 A | 8/1980 | Stillman | |
| 4,241,130 A | 12/1980 | Barnes | |
| 4,252,238 A | 2/1981 | Spiegelberg | |
| 4,262,819 A | 4/1981 | Hayes | |
| 4,337,862 A | 7/1982 | Suter | |
| 4,353,497 A | 10/1982 | Bustin | |
| 4,428,477 A | 1/1984 | Cristofolo | |
| 4,471,882 A | 9/1984 | Joo | |
| 4,526,287 A | 7/1985 | Miyamatsu et al. | |
| 4,541,546 A | 9/1985 | Imazu et al. | |
| 4,568,001 A | 2/1986 | Sander | |
| 4,572,377 A | 2/1986 | Beckett | |
| 4,606,462 A | 8/1986 | Bogren et al. | |
| 4,659,408 A | 4/1987 | Redding | |
| 4,709,397 A | 11/1987 | Voshall et al. | |
| 4,775,098 A | 10/1988 | Peer, Jr. | |
| 4,779,998 A | 10/1988 | Wischusen, III | |
| 4,792,061 A | 12/1988 | Nishida | |
| 4,810,745 A * | 3/1989 | Pike et al. | 524/516 |
| 4,834,247 A | 5/1989 | Oshima et al. | |
| 4,859,521 A * | 8/1989 | Pike et al. | 428/195.1 |
| 4,890,744 A | 1/1990 | Lane, Jr. et al. | |
| D311,488 S | 10/1990 | Regenscheid | |
| 4,978,015 A | 12/1990 | Walker | |
| 4,983,431 A | 1/1991 | Gibbons et al. | |
| 4,986,053 A | 1/1991 | Schaefer | |
| 4,997,661 A | 3/1991 | Kromer | |
| 5,009,364 A | 4/1991 | Bolte | |
| 5,024,044 A | 6/1991 | Friedrich et al. | |
| 5,041,180 A | 8/1991 | Makilaakso | |
| 5,098,794 A | 3/1992 | Schaefer | |
| 5,114,766 A | 5/1992 | Jacques | |
| 5,205,651 A | 4/1993 | Decottignies et al. | |
| 5,217,164 A | 6/1993 | Sullivan et al. | |
| 5,263,606 A | 11/1993 | Dutt et al. | |
| 5,284,540 A | 2/1994 | Roth et al. | |
| 5,350,240 A | 9/1994 | Billman et al. | |
| 5,409,115 A | 4/1995 | Barkhorn | |
| 5,460,838 A | 10/1995 | Wermund | |
| 5,493,844 A | 2/1996 | Combrink | |
| 5,587,192 A | 12/1996 | Beizermann | |
| 5,622,432 A | 4/1997 | Zicker | |
| 5,647,500 A | 7/1997 | Konno et al. | |
| 5,823,383 A | 10/1998 | Hins | |
| 5,885,673 A | 3/1999 | Light et al. | |
| 5,913,449 A | 6/1999 | Branch et al. | |
| 5,939,153 A | 8/1999 | Valyi | |
| 5,945,145 A | 8/1999 | Narsutis et al. | |
| 6,000,848 A | 12/1999 | Massioui | |
| 6,004,638 A | 12/1999 | Kaya et al. | |
| 6,050,451 A | 4/2000 | Hess, III et al. | |
| 6,076,664 A | 6/2000 | Yeager | |
| 6,099,682 A * | 8/2000 | Krampe et al. | 156/289 |
| 6,123,211 A | 9/2000 | Rashid et al. | |
| 6,199,698 B1 | 3/2001 | Hetrick et al. | |
| 6,220,310 B1 | 4/2001 | Emmer | |
| 6,226,964 B1 | 5/2001 | Vettorato | |
| 6,231,237 B1 | 5/2001 | Geller | |
| 6,261,215 B1 | 7/2001 | Imer | |
| 6,270,867 B1 | 8/2001 | Eckstein et al. | |
| 6,276,546 B1 | 8/2001 | Davis et al. | |
| 6,279,297 B1 | 8/2001 | Latronico | |
| 6,287,658 B1 | 9/2001 | Cosentino et al. | |
| 6,290,801 B1 * | 9/2001 | Krampe et al. | 156/289 |
| 6,334,710 B1 | 1/2002 | Kuge et al. | |
| 6,399,014 B1 | 6/2002 | Hermodsson | |
| 6,436,497 B1 | 8/2002 | Takahashi et al. | |
| 6,436,499 B1 * | 8/2002 | Krampe et al. | 428/40.1 |
| 6,478,190 B2 | 11/2002 | Kuge et al. | |
| D476,565 S | 7/2003 | Rosen | |
| 6,783,277 B2 | 8/2004 | Edwards et al. | |
| 6,929,400 B2 | 8/2005 | Razeti et al. | |
| 6,938,805 B2 | 9/2005 | Brincat | |
| D510,277 S | 10/2005 | Bennie et al. | |
| 7,034,268 B2 | 4/2006 | Hopkins, Sr. et al. | |
| 7,105,788 B2 | 9/2006 | Hopkins | |
| 7,115,309 B2 | 10/2006 | Akiyama et al. | |
| 7,364,047 B2 | 4/2008 | Michalsky | |
| 7,543,990 B2 | 6/2009 | Michalsky | |
| 7,740,923 B2 * | 6/2010 | Exner et al. | 428/35.2 |
| 2001/0042757 A1 | 11/2001 | Kuge et al. | |
| 2002/0112982 A1 | 8/2002 | Stagray et al. | |
| 2002/0162863 A1 | 11/2002 | Brincat | |
| 2002/0182351 A1 | 12/2002 | Akiyama et al. | |
| 2003/0059130 A1 | 3/2003 | Youneyama et al. | |
| 2003/0144122 A1 | 7/2003 | Post et al. | |
| 2004/0052987 A1 | 3/2004 | Shetty et al. | |
| 2004/0077010 A1 | 4/2004 | Meyers et al. | |
| 2004/0238475 A1 | 12/2004 | Peronek | |
| 2005/0041888 A1 | 2/2005 | Matsuzawa et al. | |
| 2006/0201903 A1 | 9/2006 | Peronek | |
| 2008/0159666 A1 * | 7/2008 | Exner et al. | 383/203 |
| 2008/0184548 A1 | 8/2008 | Michalsky | |
| 2010/0178394 A1 * | 7/2010 | Exner et al. | 426/127 |

FOREIGN PATENT DOCUMENTS

| | | |
|---|---|---|
| CA | 2342504 A1 | 10/2001 |
| CH | 669 563 A5 | 3/1989 |
| DE | 1 723 470 | 5/1956 |
| DE | 1 757 066 | 11/1957 |
| DE | 8810 166 U1 | 5/1969 |
| DE | 2 000 532 A1 | 7/1971 |
| DE | 2 100 833 | 7/1971 |
| DE | 31 06 692 A1 | 9/1972 |
| DE | 25 26 975 A1 | 12/1976 |
| DE | 2644209 A1 | 5/1977 |
| DE | 25 56 230 A1 | 7/1977 |
| DE | 3208625 A1 | 10/1982 |
| DE | 33 29 533 A1 | 3/1985 |
| DE | 37 09 867 C2 | 3/1987 |
| DE | 29 04 847 | 8/1990 |
| DE | 91 07 722.2 | 8/1991 |
| DE | 40 23 602 A1 | 1/1992 |
| DE | 3877718 T2 | 5/1993 |
| DE | 43 038 94 A1 | 8/1994 |
| DE | 4429148 A1 | 2/1996 |
| DE | 19 581 417 | 4/1996 |
| DE | 19548173 A1 | 6/1997 |
| DE | 1 786 019 | 11/1997 |
| DE | 69407954 T2 | 6/1998 |
| DE | 198 28 178 | 9/1999 |
| DE | 299 20 874 U1 | 2/2000 |
| DE | 198 60 473 A1 | 6/2000 |
| DE | 202 12 251 U1 | 1/2003 |
| DE | 202 14 197 U1 | 1/2003 |
| DE | 10238965 | 8/2003 |
| DE | 102 21 432 | 12/2003 |
| DE | 203 12 111 U1 | 12/2003 |
| DE | 202 15 255 U1 | 2/2004 |
| DE | 102 57 145 | 6/2004 |
| DE | 102004023023 A1 | 12/2005 |
| DE | 102004042968 A1 | 3/2006 |
| EP | 0 078 761 | 5/1983 |
| EP | 0 153 987 A | 9/1985 |
| EP | 0 182 416 A | 5/1986 |
| EP | 0 203 612 A2 | 5/1986 |
| EP | 0321172 A2 | 6/1989 |
| EP | 0 324 260 | 7/1989 |
| EP | 0 333 443 | 9/1989 |
| EP | 0 360 737 A | 3/1990 |
| EP | 0 379 136 | 7/1990 |
| EP | 0 446 005 | 9/1991 |

| | | | |
|---|---|---|---|
| EP | 446005 A1 * | 9/1991 |
| EP | 0 521 642 A | 1/1993 |
| EP | 0 537 109 A2 | 4/1993 |
| EP | 0595587 B1 | 5/1994 |
| EP | 0684184 | 11/1995 |
| EP | 0 772 522 | 5/1997 |
| EP | 0 785 148 A | 7/1997 |
| EP | 0833774 B1 | 4/1998 |
| EP | 0 661 219 B1 | 3/2000 |
| EP | 1 029 794 A | 8/2000 |
| EP | 1 086 906 A | 3/2001 |
| EP | 1151934 | 11/2001 |
| EP | 1174360 | 1/2002 |
| EP | 0 976 539 | 2/2002 |
| EP | 1064150 B1 | 10/2002 |
| EP | 1288139 A1 * | 3/2003 |
| EP | 1 331 174 | 7/2003 |
| EP | 1362797 A2 | 11/2003 |
| EP | 1 508 531 A | 2/2005 |
| EP | 1512637 | 3/2005 |
| EP | 1621477 | 2/2006 |
| FI | 109193 B | 2/2000 |
| FR | 2 487 805 A | 2/1982 |
| FR | 2 577 897 A | 8/1986 |
| FR | 2 729 366 | 7/1995 |
| FR | 2 859 182 A | 3/2005 |
| GB | 1 298 790 A | 12/1972 |
| GB | 2 254 594 A | 10/1992 |
| GB | 2257943 A | 1/1993 |
| GB | 2 188 520 A | 9/1997 |
| JP | 1153457 A | 6/1989 |
| JP | 10 152146 A | 6/1998 |
| JP | 2000-006999 | 1/2000 |
| JP | 2000-211675 | 8/2000 |
| JP | 2001-080650 | 3/2001 |
| JP | 2000 335630 A | 4/2001 |
| JP | 2001-176461 | 6/2001 |
| JP | 2001-176463 | 6/2001 |
| JP | 2002-104446 | 4/2002 |
| KR | 10-0274821 | 9/2000 |
| NL | 6 810 059 A | 7/1969 |
| RU | 2139824 C1 | 10/1999 |
| WO | WO 94/23945 | 10/1994 |
| WO | WO 96/03281 | 2/1996 |
| WO | WO 96/21599 A | 7/1996 |
| WO | WO 98/02305 | 1/1998 |
| WO | WO 99/46120 A1 | 9/1999 |
| WO | WO 9944903 A1 * | 9/1999 |
| WO | WO 99/64227 | 12/1999 |
| WO | WO 00/00396 | 1/2000 |
| WO | WO 0012387 | 3/2000 |
| WO | WO 00/49908 | 8/2000 |
| WO | WO 00/50314 | 8/2000 |
| WO | WO 01/83212 A | 11/2001 |
| WO | WO 02/055402 | 7/2002 |
| WO | WO 02/055405 | 7/2002 |
| WO | WO 03/018420 A | 3/2003 |
| WO | WO 03/097479 | 11/2003 |
| WO | WO 2004/101374 A | 11/2004 |
| WO | WO 2005005141 A1 * | 1/2005 |
| WO | WO 2005/105600 | 11/2005 |
| WO | WO 2006/000820 | 1/2006 |
| WO | WO 2007/042174 A1 | 4/2007 |

OTHER PUBLICATIONS

Office Action dated Nov. 10, 2010, issued for Chinese Application No. 200580049518.3.

* cited by examiner

FILM PACKAGING HAVING TAMPER-EVIDENT MEANS

CROSS REFERENCE TO RELATED APPLICATIONS

This application claims the benefit and priority to and is a U.S. National Phase of PCT International Application Number PCT/EP2005/004118, filed on Apr. 18, 2005. The disclosures of the above-reference application is hereby expressly incorporated by reference in its entirety.

The invention relates to a film packaging, especially flow-wrap packaging having a longitudinal sealed seam and two transverse sealed seams, at least the longitudinal sealed seam being spaced apart from the associated longitudinal edge of the packaging.

BACKGROUND

Packagings of this kind are used for the packaging of usually solid items, but also of soft, possibly flowable, items. They are wrapped in a rectangular or square film blank, there thus being formed a longitudinal edge opposite the wrapping edge and two transverse edges extending between that edge and the wrapping edge. The latter edges and the longitudinal edge are sealed to one another to form a longitudinal and two transverse sealed seams, so that the item is securely packaged and protected from environmental influences. The transverse sealed seams generally extend directly along the transverse edges, that is to say the lateral boundary of the packaging, while the longitudinal sealed seam is spaced apart from the associated longitudinal edge. It is thus possible to open the packaging relatively conveniently from the longitudinal edge side. It is merely necessary to separate the two longitudinal edge strips, which are each defined by the longitudinal sealed seam and the longitudinal edge and which are in direct contact with one another, by means of two thumbs or two fingers and then to hold each of them firmly between thumb and finger. The two longitudinal edge strips can then be pulled apart to open the longitudinal sealed seam. In order to facilitate separation of the two longitudinal edge strips, one of the longitudinal edge strips is very slightly broader than the other longitudinal edge strip, so that the one longitudinal edge strip projects very slightly beyond the other longitudinal edge strip, preferably by about 1 to 2 mm.

A disadvantage of such known packagings, however, is that the user cannot easily see whether or not the packaging has already been opened either by himself or by a third party. This is the case especially when the packaging is a resealable packaging, more especially a packaging in which at least a portion of the longitudinal sealed seam, especially both the longitudinal sealed seam and the two transverse sealed seams, are formed by cold-seal adhesive strips that are in contact with one another and are capable of being restuck a number of times. Such packagings can easily be opened and resealed without it being evident to a subsequent purchaser.

The problem underlying the present invention is therefore to produce a packaging that provides reliable evidence of being opened for the first time.

This problem is solved by the characterising features of claim 1, preferred structural details and embodiments being described in the subsidiary claims.

A key feature of the invention is therefore that at at least one point between the longitudinal sealed seam and the longitudinal edge there is arranged a device for indicating whether the packaging has already been opened, that is to say a so-called "seal guarantee". It will be understood that such quality seals can also be provided in the region of the transverse sealed seams, especially when they are also capable of being resealed.

A particularly simple embodiment of a device for indicating whether a packaging has already been opened, especially one that is also simple from the production technology standpoint, is characterized in that there is arranged on the inner side of one of the two longitudinal edge strips a so-called adhesive tag (circular, oval, rectangular or the like) which is associated with a colour marking on the inner side of the other, or opposite, longitudinal edge strip, wherein, on detachment of the adhesive tag from that colour marking, colorant remains clearly visibly adhering to the adhesive tag. If, therefore, the two longitudinal edge strips are manipulated for the purposes of opening, this will be clearly evident to the purchaser of the packaging. It is necessary merely to check whether or not the adhesive tag has been coloured. Such an adhesive tag is preferably not capable of being restuck.

The colorant which serves for marking the adhesive tag when the packaging is opened is preferably applied directly to a film forming the film packaging and/or to a suitable film laminate on the adhesive side of the film or the laminate, for example by means of gravure printing.

It should be noted in connection with the cold-seal adhesive used herein that it preferably consists of an acrylic-based material and, at least in the region of the longitudinal sealed seam, is capable of being restuck at least three times, especially up to 10 to 15 times, without the closure strength being appreciably affected.

The cold-seal adhesive has especially been produced on the basis of a water-based styrene-acrylate dispersion and is such that on each closing or re-sticking operation it has a closure strength having at least 50% to 80% of the preceding closure strength.

According to the invention the initial closure strength of the cold-seal adhesive is in the range of from 3.2 N/15 mm to 2.5 N/15 mm, preferably in the range of from 3.0 N/15 mm to 2.65 N/15 mm and more especially in the range of from 2.75 N/15 mm to 2.85 N/15 mm.

On the basis of such an initial closure strength, multiple re-sticking by means of which the packaging is securely closed after resealing can advantageously be realised in a simple way.

According to the invention, the cold-seal adhesive has a solids content in the range of from 40% to 65%, preferably in the range of from 45% to 60% and more especially in the range of from 50% to 53%. The viscosity of the cold-seal adhesive at 25° C. is in the range of from 350 cp to 650 cp, preferably in the range of from 400 cp to 580 cp and more especially in the range of from 480 cp to 520 cp, the viscosity being determined in accordance with Brookfield ASTM D3236.

Furthermore, the application weight of the cold-seal adhesive is in the range of from 3.8 $g/m^2$ to 5.2 $g/m^2$, preferably in the range of from 4.2 $g/m^2$ to 4.8 $g/m^2$ and more especially in the range of from 4.35 $g/m^2$ to 4.55 $g/m^2$.

The colorant used for marking the adhesive tag is water-based and has a solids content in the range of from 28% to 42%, preferably in the range of from 32% to 38% and more especially in the range of from 33% to 34.5%, the colorant having a viscosity at 20° C. in the range of from 75"±10" B6 cup, preferably 75"±5" B6 cup (corresponds to 805 cp±53.13 cp according to Brookfield ASTM D3236).

The application dry weight of the colorant is in the range of from 0.25 $g/m^2$ to 2.8 $g/m^2$, preferably in the range of from 0.8 $g/m^2$ to 1.8 $g/m^2$ and especially in the range of from 1.0 $g/m^2$ to 1.5 $g/m^2$.

When the above-mentioned parameters are observed, a seal guarantee according to the invention by means of an adhesive tag and a colour marking associated therewith can be produced without problems. Such a seal guarantee is accordingly capable of being produced in an extremely simple way, it being possible to use a very wide range of printing technologies and special preference being given to flexographic and/or gravure printing, because both the above-defined colorant(s) and the above-defined cold-seal adhesive are suitable for flexographic and/or gravure printing.

In accordance with a practical embodiment, the colorant used is applied by means of a printer unit directly to the acrylic side of a film, for example a film of an oriented polypropylene, the adhesive strength between the film and the colorant applied thereto being relatively low and tending towards 0 N/15 mm, but still being sufficiently high that the colorant has adequate resistance to abrasion and to breakage and remains securely on the film until the packaging is stuck together, i.e. closed.

Following the application of the colorant to the film, the film including the colorant is overprinted with a cold-seal adhesive, the adhesive strength between the film and the cold-seal adhesive being greater than the adhesive strength between the colorant layer underneath the cold-seal adhesive and the film.

The functioning of the seal guarantee, or the adhesive tag, is based on the fact that for sealing the packaging the longitudinal sealed seams of the packaging, which are coated with cold-seal adhesive, are brought together so that two cold-seal adhesive layers or a cold-seal adhesive layer and a film layer come into contact, so that the packaging is closed by all-round adhesion, that is to say from wrapping edge to wrapping edge.

The resulting layer structure is accordingly as follows: film/cold-seal adhesive=cold-seal adhesive/colorant/film or alternatively film=cold-seal adhesive/colorant/film. Accordingly the "=" reflects the point in the layer structure that provides for sealing the film packaging, that is to say the adhesive bond between the two longitudinal edge strips.

As a result of the afore-mentioned relatively weak adhesive strength between the colorant layer and the film in comparison with the adhesive strength between the cold-seal adhesive and the film, when that seal is opened the colorant layer remains adhering to the adhesive in the region of the adhesive tag and is at least partly torn or detached from the film therewith, so that after the packaging has been opened the adhesive tag is coloured by the colorant. Accordingly, when the packaging is opened the seal is broken in the region of the adhesive tag not in a reverse procedure with respect to the procedure used for sealing the packaging, wherein two cold-seal adhesive layers or a cold-seal adhesive layer and a film are brought into contact, but is broken at the weakest point of the layer structure formed, or defined, by the bond between the colorant and the film.

It should be mentioned at this point that the film for the production of the film packaging according to the invention can be in the form of a standard film or in the form of a film laminate. If desired, the laminate is provided with a metal layer and is preferably in the form of an aluminium laminate which has at least one sealing layer and optionally a barrier layer, for example of $SiO_2$, ethyl vinyl alcohol (EVOH) or an oriented polyolefin, especially polypropylene (OPP). Furthermore, the oriented polyolefin is preferably unidirectionally stretched.

As an alternative to the above-mentioned device for indicating whether a packaging has already been opened, it can be defined by an adhesion or sealing point, the sealing point being bounded by tear-lines at least on one of the two longitudinal edge strips so that when the packaging is opened for the first time a correspondingly bounded edge strip portion is visibly separated together with the sealing point. The longitudinal edge strip in question is then visibly destroyed after the packaging has been opened for the first time. In that respect, the user is provided with a seal guarantee similar to that provided by a quality ring on the screw closure of a bottle of mineral water.

Preferably, a plurality of devices for indicating whether the packaging has already been opened are located, spaced apart from one another, in the region of the longitudinal edge strips that are in contact with one another, the spacing between the devices being such that if an opening is made between them there is insufficient space to gain access to the contents of the packaging.

Further embodiments of the invention will be found in the subsidiary claims.

BRIEF DESCRIPTION OF DRAWINGS

The invention will be described below with reference to embodiments which are explained in greater detail with reference to the Figures.

SUMMARY

Figure 1:
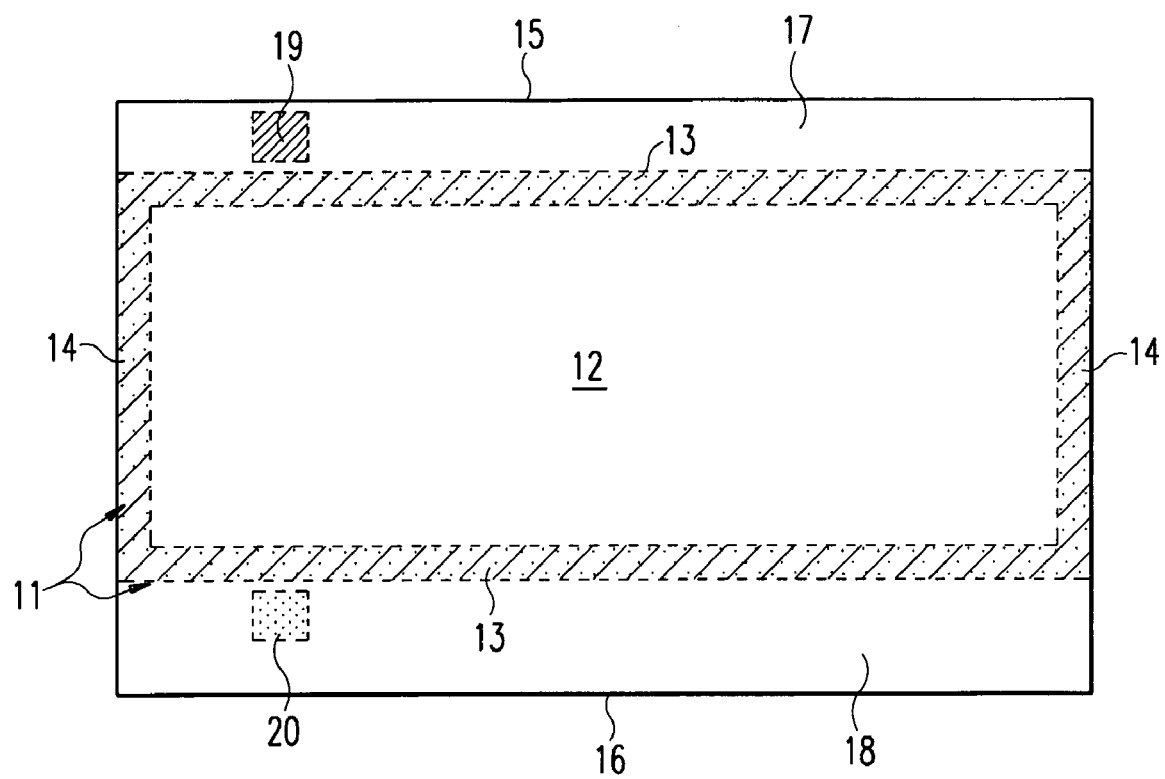
FIG. 1 shows a rectangular blank for a flow-wrap packaging according to the invention in a plan view onto the side on which cold-seal adhesive strips for forming longitudinal and transverse sealed seams have been applied.

As already mentioned at the beginning, a flow-wrap packaging 10 is produced from a square or rectangular (as herein according to FIG. 1 and FIG. 3) film blank (12). In accordance with FIG. 1, the film blank 12 is provided on one side with a cold-seal adhesive. The cold-seal adhesive is applied in the form of a rectangular frame 11, the first two opposing cold-seal adhesive strips 14 being located directly along the corresponding edges of the packaging film blank 12 and the other two opposing cold-seal adhesive strips 13 being spaced apart, and by different amounts, from the associated edges 15, 16 of the packaging film blank 12. The two last-mentioned edges 15, 16 form longitudinal edges of the packaging, whereas the two first-mentioned edges define the transverse edges thereof.

The cold-seal adhesive strips 13 accordingly form also the longitudinal sealed seam of the packaging 10, while the cold-seal adhesive strips 14 define the two transverse sealed seams. The longitudinal sealed seam 13 is spaced apart from the longitudinal edges 15, 16 of the packaging 10, the longitudinal edge 16 being spaced slightly further away from the longitudinal sealed seam than longitudinal edge 15. The longitudinal edge 16 therefore projects slightly beyond the longitudinal edge 15, especially by about from 1.0 to 2.0 mm. The two longitudinal edges and the associated longitudinal edge strips can thus more easily be spread apart for opening the packaging 10. The longitudinal edge strips associated with the longitudinal edges 15, 16 have been given the reference numerals 17, 18.

Figure 2:
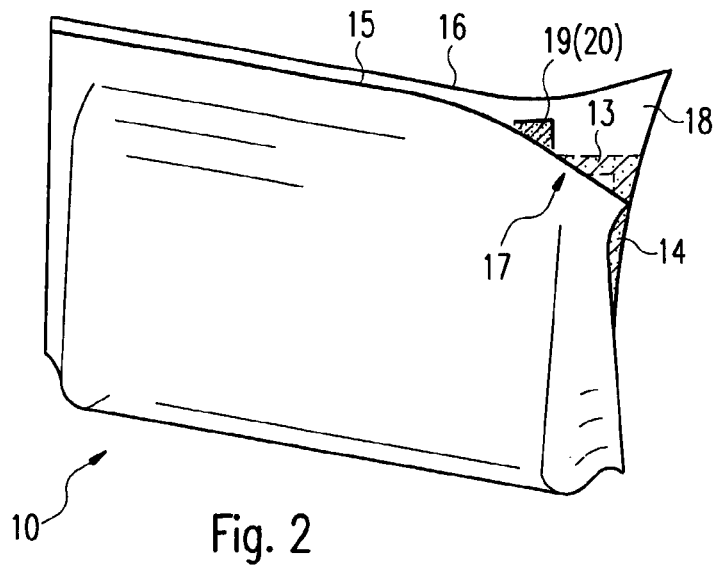
FIG. 2 is a perspective view of a packaging formed from the blank according to FIG. 1 which has been opened at one corner.
Figure 3:
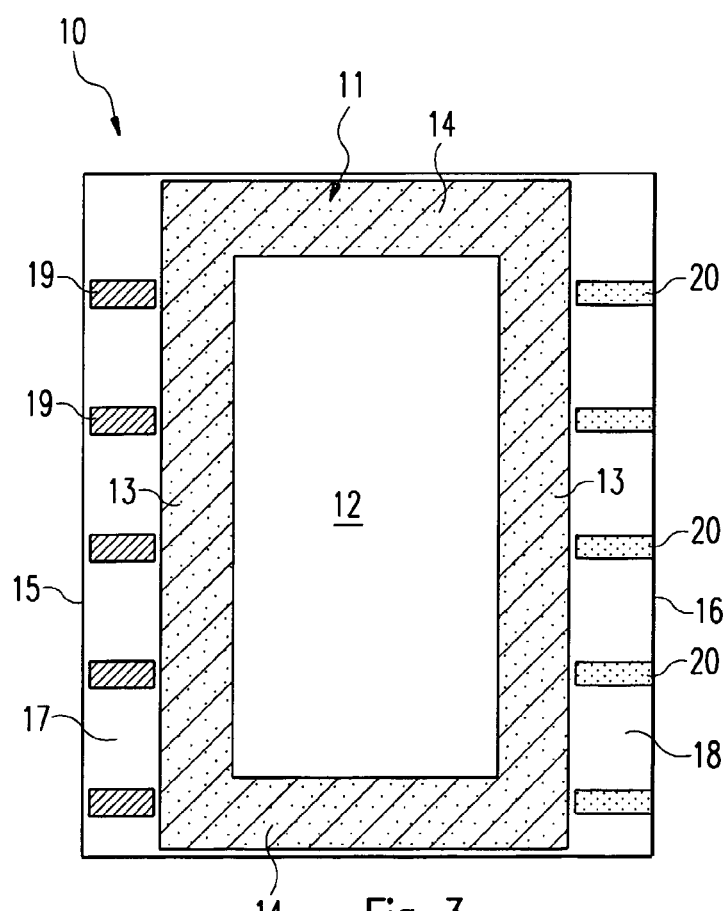
FIG. 3 shows a variant of a rectangular blank according to FIG. 1.

At at least one point between the longitudinal sealed seam 13 and the longitudinal edge 15, 16, that is to say at least one point on the longitudinal edge strips 17, 18 defined by the longitudinal sealed seam and the longitudinal edge, there is arranged according to FIG. 1 a device for indicating whether the packaging 10 has already been opened, there being shown in accordance with FIG. 3 five such devices which are arranged spaced apart from one another along the longitudinal sealed seam which does not allow access to the contents of the packaging without at least one of the seal guarantee devices being damaged. In the embodiment shown, such a device is formed by a non-restickable (cold-seal) adhesive tag 19 on the inner side of one of the two longitudinal edge strips, here longitudinal edge strip 17, and, associated therewith, a colour marking 20 on the inner side of the other, or opposite, longitudinal edge strip 18, wherein, on detachment of the adhesive tag 19 from the colour marking 20, colorant remains clearly visible adhering to the adhesive tag 19 (indicated in FIG. 2). When the two longitudinal edge strips 17, 18 are spread apart, the user can therefore very quickly identify the colorant on the adhesive tag 19 and it will be evident that at least an attempt has already been made to open the packaging. Only when the longitudinal edge strips 17, 18 are still firmly bonded to one another in the region of the adhesion point 19 does the user know that the packaging has not yet been opened. If, however, the longitudinal edge strips 17, 18 can be spread apart without difficulty over their entire length and the user can see a colour marking in the region of the adhesive tag 19, this is an indication that the packaging has already been opened or, at least, an attempt has previously been made to open the packaging. Of course, this feature is useful only when at least a portion of the longitudinal sealed seam 13 is formed by cold-seal adhesive strips that are in contact with one another and are capable of being restuck a number of times, that is to say are capable of multiple resealing. Otherwise, the sealed seam itself is a guarantee of quality. That is to say, packagings having non-resealable sealed seams do not, of course, require a first-opening quality seal.

Figure 4:
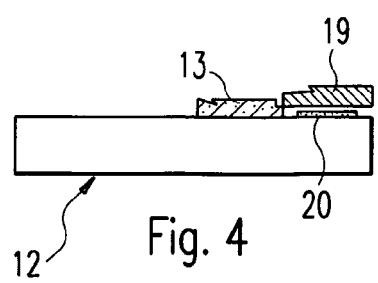
FIG. 4 is a diagrammatic view, in section, of the layer structure of film, colorant and cold-seal adhesive in the region of an adhesive tag.

An arrangement of the layer structure according to the invention is shown in FIG. 4, wherein in the region of an adhesive tag 19 there is located, underneath the adhesive tag, a colour marking 20 which has in turn been applied directly to a film blank 12. Alongside the adhesive tag 19, a cold-seal adhesive strip 13 is arranged directly on the blank 12. It should be pointed out here that when adhesive has been applied to the same height both directly to the blank 12 and to the colour marking 20, there will be a slight increase in height above the colour marking 20 by means of which increased pressure is exerted in the region of the adhesive tag when the packaging is sealed, so that the adhesive tag 19 becomes intimately bonded to the colour marking 20, so that when the packaging is opened the colour marking 20 is guaranteed to adhere to the adhesive tag 19.

Alternatively it is also possible to define the device for indicating whether the packaging has already been opened by means of an adhesion or sealing point, the sealing point being bounded by tear-lines at least on one of the two longitudinal edge strips, so that when the packaging is opened for the first time a correspondingly bounded edge strip portion is visibly separated together with the sealing point. In this embodiment, one of the two longitudinal edge strips 17 or 18 is visibly destroyed after the packaging has been opened.

In the region between the two longitudinal edge strips 17, 18 there is preferably arranged over the length thereof a plurality of devices for indicating first-opening of the packaging, which devices are arranged spaced apart from one another, the spacing between the devices being such that it is virtually impossible to gain access to the packaging between them. Of course, it is also possible for devices for indicating first-opening of the packaging to be provided in the region of the transverse sealed seams. This ultimately depends upon the specific form of the packaging and the arrangement of the longitudinal and transverse sealed seams.

All the features disclosed in the application documents are claimed as being important to the invention, where they are novel with respect to the prior art either singly or in combination.

Figure 5:
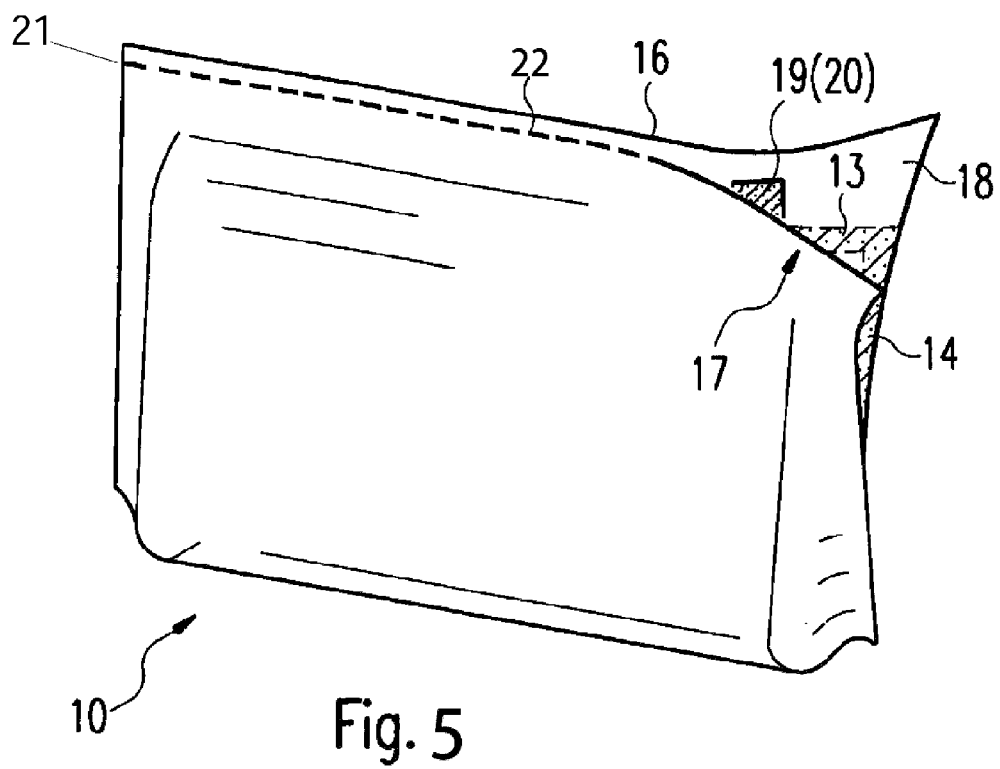
Fig. 5 is a perspective view of a packaging formed from the blank according to FIG. 1 which shows a sealing point that is bonded by tear-lines.

An arrangement of a sealing point and tear-lines according to the invention is shown in FIG. 5, in which 21 indicates the sealing point and 22 indicates the tear-lines.

REFERENCE NUMERALS 10 flow-wrap packaging
11 cold-seal adhesive frame
12 blank
13 cold-seal adhesive strip (for forming a longitudinal sealed seam)
14 cold-seal adhesive strip (for forming two transverse sealed seams)
15 edge (longitudinal edge of packaging)
16 edge (longitudinal edge of packaging)
17 longitudinal edge strip
18 longitudinal edge strip
19 adhesive tag (quality seal)
20 colour marking comprising colorant
21 sealing point
tear-lines

What is claimed is:

1. A packaging selected from the group consisting of film packaging and flow-wrap film packaging, said packaging having a longitudinal sealed seam and two transverse sealed seams, at least the said longitudinal sealed seam being spaced apart from an associated longitudinal edge of the packaging, wherein: at at least one point between said longitudinal sealed seam and said longitudinal edge, so that at at least one point on longitudinal edge strips of the packaging defined by said longitudinal sealed seam and said longitudinal edge, there is arranged a device for indicating whether the packaging has already been opened,
   wherein said device for indicating whether the packaging has already been opened is formed by a tag selected from the group consisting of a non-restickable adhesive tag, and a non-restickable cold-seal adhesive tag, on the inner side of one of two longitudinal edge strips and, associated therewith, a color marking on the inner side of the other, or opposite, longitudinal edge strip, wherein, on detachment of the adhesive tag from the colour marking, colorant remains visibly adhering to said adhesive tag, and
   wherein: said device for indicating whether the packaging has already been opened is defined by an adhesion or sealing point, the sealing point being bounded by tear-lines at least on one of the said two longitudinal edge strips so that when the packaging is opened for the first time a correspondingly bounded edge strip portion is visibly separated together with the sealing point.

2. A packaging selected from the group consisting of film packaging and flow-wrap film packaging, said packaging having a longitudinal sealed seam and two transverse sealed seams, at least the said longitudinal sealed seam being spaced apart from an associated longitudinal edge of the packaging, wherein: at at least one point between said longitudinal sealed seam and said longitudinal edge, so that at at least one point on longitudinal edge strips of the packaging defined by said longitudinal sealed seam and said longitudinal edge, there is arranged a device for indicating whether the packaging has already been opened, wherein said device for indicating whether the packaging has already been opened is formed by a tag selected from the group consisting of a non-restickable adhesive tag, and a non-restickable cold-seal adhesive tag, on the inner side of one of two longitudinal edge strips and, associated therewith, a color marking on the inner side of the other, or opposite, longitudinal edge strip, wherein, on detachment of the adhesive tag from the colour marking, colorant remains visibly adhering to said adhesive tag, and wherein: the cold-seal adhesive is an adhesive produced on the basis of a water-based styrene-acrylate dispersion and, at least in the region of the longitudinal sealed seam, is capable of being restuck by a number of times selected from the group consisting of at least three times and up to 10 to 15 times, without the closure strength being appreciably affected (so that still having at least 50% to 80% of the preceding closure strength).

3. A packaging selected from the group consisting of film packaging and flow-wrap film packaging, said packaging having a longitudinal sealed seam and two transverse sealed seams, at least the said longitudinal sealed seam being spaced apart from an associated longitudinal edge of the packaging, wherein: at at least one point between said longitudinal sealed seam and said longitudinal edge, so that at at least one point on longitudinal edge strips of the packaging defined by said longitudinal sealed seam and said longitudinal edge, there is arranged a device for indicating whether the packaging has already been opened, wherein said device for indicating whether the packaging has already been opened is formed by a tag selected from the group consisting of a non-restickable adhesive tag, and a non-restickable cold-seal adhesive tag, on the inner side of one of two longitudinal edge strips and, associated therewith, a color marking on the inner side of the other, or opposite, longitudinal edge strip, wherein, on detachment of the adhesive tag from the colour marking, colorant remains visibly adhering to said adhesive tag, and wherein: the initial closure strength of the cold-seal adhesive is in a range selected from the group consisting of from 3.2 N/15 mm to 2.5 N/15 mm, from 3.0 N/15 mm to 2.65 N/15 mm and from 2.75 N/15 mm to 2.85 N/15 mm.

4. A packaging selected from the group consisting of film packaging and flow-wrap film packaging, said packaging having a longitudinal sealed seam and two transverse sealed seams, at least the said longitudinal sealed seam being spaced apart from an associated longitudinal edge of the packaging, wherein: at at least one point between said longitudinal sealed seam and said longitudinal edge, so that at at least one point on longitudinal edge strips of the packaging defined by said longitudinal sealed seam and said longitudinal edge, there is arranged a device for indicating whether the packaging has already been opened, wherein said device for indicating whether the packaging has already been opened is formed by a tag selected from the group consisting of a non-restickable adhesive tag, and a non-restickable cold-seal adhesive tag, on the inner side of one of two longitudinal edge strips and, associated therewith, a color marking on the inner side of the other, or opposite, longitudinal edge strip, wherein, on detachment of the adhesive tag from the colour marking, colorant remains visibly adhering to said adhesive tag, and wherein: said cold-seal adhesive has a solids content in a range selected from the group consisting of from 40% to 65%, from 45% to 60% and from 50% to 53%, and a viscosity (at 25° C.) in a range selected from the group consisting of from 350 cp to 650 cp, from 400 cp and 580 cp and from 480 cp to 520 cp according to Brookfield ASTM D3236.

5. A packaging selected from the group consisting of film packaging and flow-wrap film packaging, said packaging having a longitudinal sealed seam and two transverse sealed seams, at least the said longitudinal sealed seam being spaced apart from an associated longitudinal edge of the packaging, wherein: at at least one point between said longitudinal sealed seam and said longitudinal edge, so that at at least one point on longitudinal edge strips of the packaging defined by said longitudinal sealed seam and said longitudinal edge, there is arranged a device for indicating whether the packaging has already been opened, wherein said device for indicating whether the packaging has already been opened is formed by a tag selected from the group consisting of a non-restickable adhesive tag, and a non-restickable cold-seal adhesive tag, on the inner side of one of two longitudinal edge strips and, associated therewith, a color marking on the inner side of the other, or opposite, longitudinal edge strip, wherein, on detachment of the adhesive tag from the colour marking, colorant remains visibly adhering to said adhesive tag, and wherein: the application weight of the cold-seal adhesive is in a range selected from the group consisting of from 3.8 $g/m^2$ to 5.2 $g/m^2$, from 4.2 $g/m^2$ to 4.8 $g/m^2$ and from 4.35 $g/m^2$ to 4.55 $g/m^2$.

6. A packaging selected from the group consisting of film packaging and flow-wrap film packaging, said packaging having a longitudinal sealed seam and two transverse sealed seams, at least the said longitudinal sealed seam being spaced apart from an associated longitudinal edge of the packaging, wherein: at at least one point between said longitudinal sealed seam and said longitudinal edge, so that at at least one point on longitudinal edge strips of the packaging defined by said longitudinal sealed seam and said longitudinal edge, there is arranged a device for indicating whether the packaging has already been opened, wherein said device for indicating whether the packaging has already been opened is formed by a tag selected from the group consisting of a non-restickable adhesive tag, and a non-restickable cold-seal adhesive tag, on the inner side of one of two longitudinal edge strips and, associated therewith, a color marking on the inner side of the other, or opposite, longitudinal edge strip, wherein, on detachment of the adhesive tag from the colour marking, colorant remains visibly adhering to said adhesive tag, and wherein: the colorant has a solids content in a range selected from the group consisting of from 28% to 42%, from 32% to 38% and from 33% to 34.5%, and having a viscosity (at 20° C.) in a arrange selected from the group consisting of from 75" ±5" B6 cup (corresponding to 805 cp±53.13 cp according to Brookfield ASTM D3236).

7. A packaging selected from the group consisting of film packaging and flow-wrap film packaging, said packaging having a longitudinal sealed seam and two transverse sealed seams, at least the said longitudinal sealed seam being spaced apart from an associated longitudinal edge of the packaging, wherein: at at least one point between said longitudinal sealed seam and said longitudinal edge, so that at at least one point on longitudinal edge strips of the packaging defined by said longitudinal sealed seam and said longitudinal edge, there is arranged a device for indicating whether the packaging has already been opened,
    wherein said device for indicating whether the packaging has already been opened is formed by a tag selected from the group consisting of a non-restickable adhesive tag, and a non-restickable cold-seal adhesive tag, on the inner side of one of longitudinal edge strips and, associated therewith, a color marking on the inner side of the other, or opposite, longitudinal edge strip, wherein, on detachment of the adhesive tag from the colour marking, colorant remains visibly adhering to said adhesive tag, and
    wherein: the colorant is a water-based ink.

8. A packaging selected from the group consisting of film packaging and flow-wrap film packaging, said packaging having a longitudinal sealed seam and two transverse sealed seams, at least the said longitudinal sealed seam being spaced apart from an associated longitudinal edge of the packaging, wherein: at at least one point between said longitudinal sealed seam and said longitudinal edge, so that at at least one point on longitudinal edge strips of the packaging defined by said longitudinal sealed seam and said longitudinal edge, there is arranged a device for indicating whether the packaging has already been opened,
    wherein said device for indicating whether the packaging has already been opened is formed by a tag selected from the group consisting of a non-restickable adhesive tag, and a non-restickable cold-seal adhesive tag, on the inner side of one of two longitudinal edge strips and, associated therewith, a color marking on the inner side of the other, or opposite, longitudinal edge strip, wherein, on detachment of the adhesive tag from the colour marking, colorant remains visibly adhering to said adhesive tag, and
    wherein: the application dry weight of the colorant is in a range selected from the group consisting of from 0.25 $g/m^2$, from 0.8 $g/m^2$ to 1.8 $g/m^2$ and from 1.0 $g/m^2$ to 1.5 $g/m^2$.

\* \* \* \* \*